(12) United States Patent
Chi et al.

(10) Patent No.: US 8,242,826 B2
(45) Date of Patent: Aug. 14, 2012

(54) RETENTION FLIP-FLOP

(75) Inventors: Shyh-An Chi, Hsinchu (TW); Shiue Tsong Shen, Tuki Township, Yunlin County (TW); Jyy Anne Lee, Taipei (TW); Yun-Han Lee, Baoshan Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 176 days.

(21) Appl. No.: 12/758,096

(22) Filed: Apr. 12, 2010

(65) Prior Publication Data

US 2011/0248759 A1 Oct. 13, 2011

(51) Int. Cl.
*H03K 3/356* (2006.01)
(52) U.S. Cl. ............................................. 327/203
(58) Field of Classification Search .................. None
See application file for complete search history.

(56) References Cited

U.S. PATENT DOCUMENTS

| 7,346,820 B2 | 3/2008 | Padhye et al. |
| 7,616,041 B2 * | 11/2009 | Frederick et al. ............. 327/202 |
| 7,652,513 B2 * | 1/2010 | Rao et al. ...................... 327/203 |
| 2008/0303573 A1 | 12/2008 | Hsieh et al. |

OTHER PUBLICATIONS

Keating M., et al., Low Power Methodology Manual for System-on-Clip Design, Chapter 13: Retention Register Design, Copyright 2007 by Synopsys, Inc. & ARM Limited, published by Springer Science+Business Media, LLC, 233 Spring Street, New York, NY 10013, USA, pp. 210-218.

* cited by examiner

*Primary Examiner* — Lincoln Donovan
*Assistant Examiner* — Sibin Chen
(74) *Attorney, Agent, or Firm* — Duane Morris LLP

(57) ABSTRACT

A master-slave retention flip-flop includes a master latch adapted to latch an input data signal and to output a latched master latch data signal based on an input clock signal, a slave latch coupled to an output of the master latch and adapted to output a latched slave latch data signal based on the input clock signal, and a retention latch embedded within one of the master and slave latches adapted to preserve data in a power down mode based on a power down control signal.

19 Claims, 14 Drawing Sheets

RETENTION FLIP-FLOP

FIELD OF THE INVENTION

The present invention relates to retention flip-flops, and more specifically to retention flip-flops with master-slave latches.

BACKGROUND OF THE INVENTION

Many circuit designs require fast resumption of operation after wakeup from sleep mode. In these designs, it is necessary to save the current data state before going into sleep mode and to restore the state at wakeup. One such on-chip retention method is the so-called dual pin balloon register, which uses separate save and restore control pins and a second slave latch for retention. This dual pin balloon register is illustrated in FIG. 1.

FIG. 1 is a high level block diagram of a prior art retention register 10. The retention register 10 is based on a conventional D-type flip-flop, which is represented by master-slave latches 12, 14. As will be familiar to those in this art, the Q output of the D flip-flop always takes on the state of the D input at the moment of a positive edge (or negative edge if the clock input is active low). It is called the D flip-flop for this reason, since the output takes the value of the D input or Data input, and delays it by one clock count. The retention register has an extra data preserving circuit sometimes referred to as a "shadow" latch or "balloon" latch 16. The latches 12, 14 of the D flip-flop are designed from standard, low Vt transistors whereas the balloon latch 16 is designed with weak high Vt transistors. This third latch 16 is connected to an always on power supply (True VDD) and holds the register state while the leaky master-slave register latches are powered down in sleep mode. This design requires complicated timing for transferring data back and forth between the balloon latches and the flip-flop on any transition from power-down to active mode and vice versa. The design complexities come in part from allowing the retention register to restore the retained data value regardless of the state of the clock. If the clock is low and the master latch is open and sampling input data the retained value is forced into the slave latch. If the clock is high, however, the retention latch value is forced into the master latch and then propagates to the slave latch when the clock goes low. The design also suffers from large size, power and delay related problems.

A lower power, small area retention flip-flop is desired.

SUMMARY OF THE INVENTION

In an embodiment of the present invention, a master-slave retention flip-flop includes a master latch adapted to latch an input data signal and to output a latched master latch data signal based on an input clock signal, a slave latch coupled to an output of the master latch and adapted to output a latched slave latch data signal based on the input clock signal, and a retention latch embedded within one of the master and slave latches adapted to preserve data in a power down mode based on a power down control signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Relative terms are for convenience of description and do not require that the apparatus be constructed or operated in a particular orientation. Terms concerning communication, coupling and the like, such as "connected" and "interconnected," refer to a relationship wherein features communicate with one another either directly or indirectly through intervening structures, unless expressly described otherwise.

An improved retention flip flop design is presented herein. The retention flip-flop exhibits excellent layout size, reduced leakage power in both operational and sleep modes and good timing performance.

Figure 1:
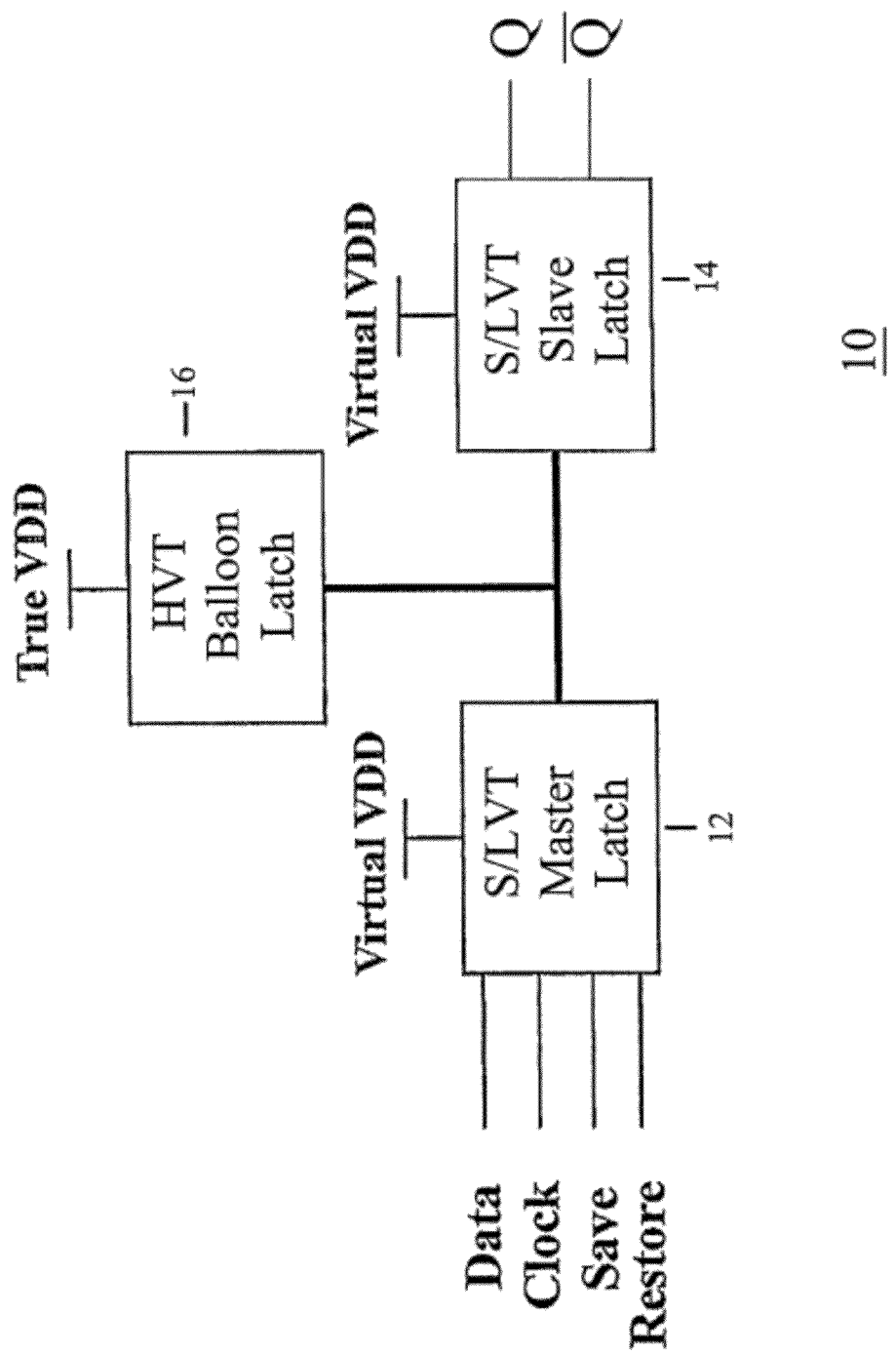
FIG. 1 is a block diagram of a prior art retention flip-flop.
Figure 2A:
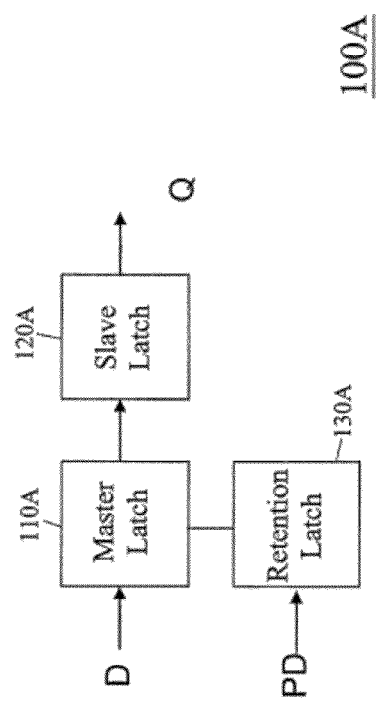
FIGS. 2A and 2B are block diagrams of embodiments of a retention flip-flop according to the present invention.
Figure 2B:
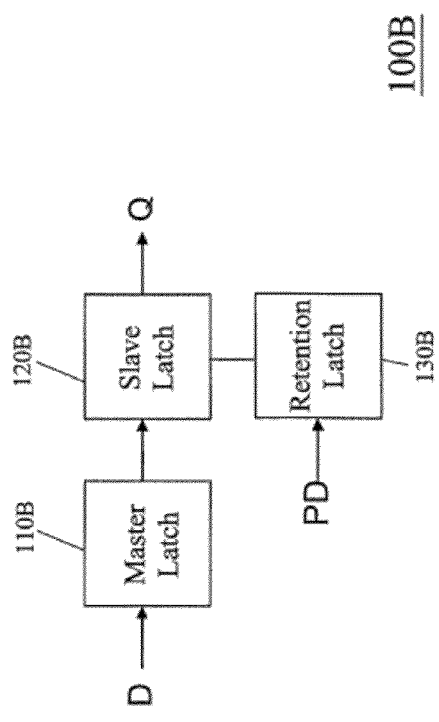

FIGS. 2A and 2B illustrate high level depictions of embodiments of retention flip-flops 100A, 100B. In FIG. 2A, the retention flip-flop 100A includes a master latch 110A coupled to a slave latch 120A. A retention latch 130A responsive to a power down control signal PD is embedded within the master latch 110A for retaining data during a power down mode. In FIG. 2B, the retention latch 130B is embedded within the slave latch 120B rather than master latch 110B. As discussed in more detail below, embedding the retention latch in one of the master and slave latches removes the retention circuitry from the critical path between the master and slave latches (compare FIG. 1 retention flip-flop 10), which reduces design complexity and timing issues as well as allows for improved power efficiency.

Figure 3A:
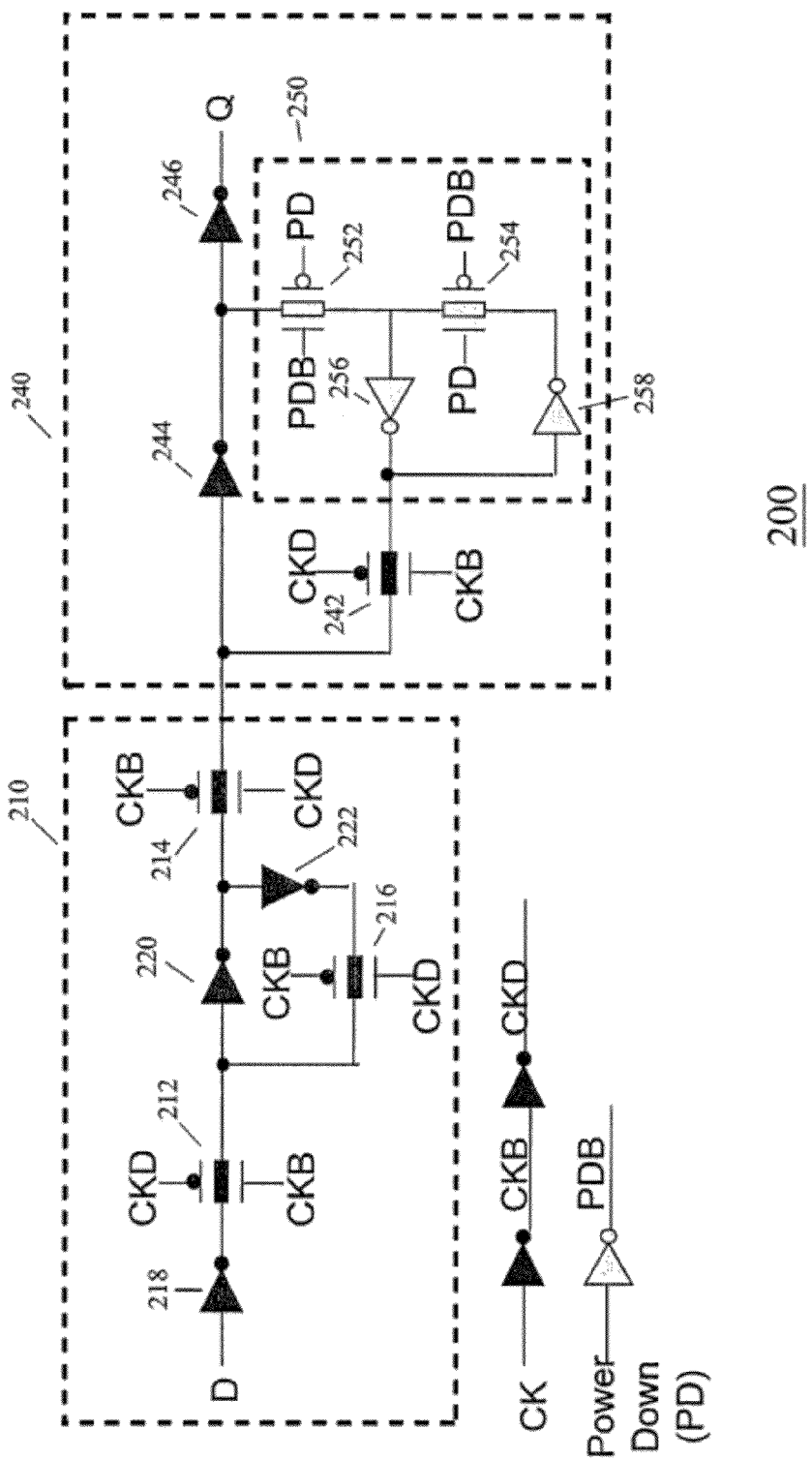
FIGS. 3A-3B and 3D to 3E are embodiments of a retention flip-flop having a retention latch embedded within a slave latch.

FIG. 3A illustrates an embodiment of a retention flip-flop 200 embodied as a D type flip-flop. The retention flip-flop includes a master latch circuit 210 coupled to a slave latch circuit 240. In this embodiment, a retention latch is embedded within the slave latch 240. The devices (i.e., inverter and transmission/pass gates) shown in dark shading represent devices that are powered by a virtual VDD source, i.e., a VDD source that goes low during power down/sleep mode. The devices shown in light gray shading (also illustrated by block 250) represent devices that are powered by a true, always on VDD source (i.e., a VDD source that is available during power down). These two sets of devices may have different threshold voltages (Vt), gate lengths, junction doping concentrations, gate oxide thicknesses, substrate biases, etc. In embodiments, the device that are powered by the True VDD exhibit lower leakage current than devices powered by the virtual VDD, as leakage current is a significant concern during sleep mode.

The input data signal is represented as data signal D and the output data signal is represented as output Q. A clock signal CK, more specifically clock bar and clock signals CKB, CKD, respectively, control CMOS pass gates 212, 214, 216 and 242. Clock signal CK is inverted twice in order to address loading issues due to the number of gates controlled by the clock signal. Power down signal PD controls CMOS transmission gates 252, 254.

The operation of the master latch 210 is controlled by the clock signal CKB/CKD. Data signal D is initially inverted by inverter 218. When CKD is low, the inverted data passes through transmission gate 212 and the value of D is held by the output of inverter 220, with pass gate 216 off. On the next clock transition, i.e., when CKD is high, the pass gates 214 and 216 turn on and gate 212 is off. With pass gate 216 on, the inverter ring of inverters 220 and 222 hold the data state as the master latch 210 passes the data to the slave latch 240 through gate 214.

The slave latch 240 includes a primary storage ring formed from inverter 244, CMOS transmission gate 252, inverter 256 and CMOS transmission gate 242. The slave latch 240 also include a secondary storage ring formed from inverter 256, inverter 258 and transmission gate 254. The slave latch 240 also includes an output inverter 246. During normal operation, when CKD goes high, the data held by master latch 210 is passed through transmission gate 214 and then twice inverted by inverters 244, 246 to provide data signal Q. Since the circuit is not in power down/sleep mode, power down signal PD is low and the transmission gate 252 is on. When CKD goes low, gate 214 is off and gate 242 is on. Inverters 244 and 256 maintain the inverter data state at the input of inverter 246 and the data is outputted as data signal Q. During sleep mode, transmission gate 254 is off, deactivating the secondary storage ring.

During power down/sleep mode, all of the devices powered by the virtual VDD are powered down. The primary storage ring is inactive. However, in power down mode, all of the true VDD powered devices in block 250 are active. Signal PD goes high, which turns off CMOS transmission gate 252. CMOS transmission gate 254 is on, activating the secondary storage ring. The data held in the slave latch at the time of power down is held in the secondary storage ring (i.e., by the inverters 256 and 258).

Figure 3B:
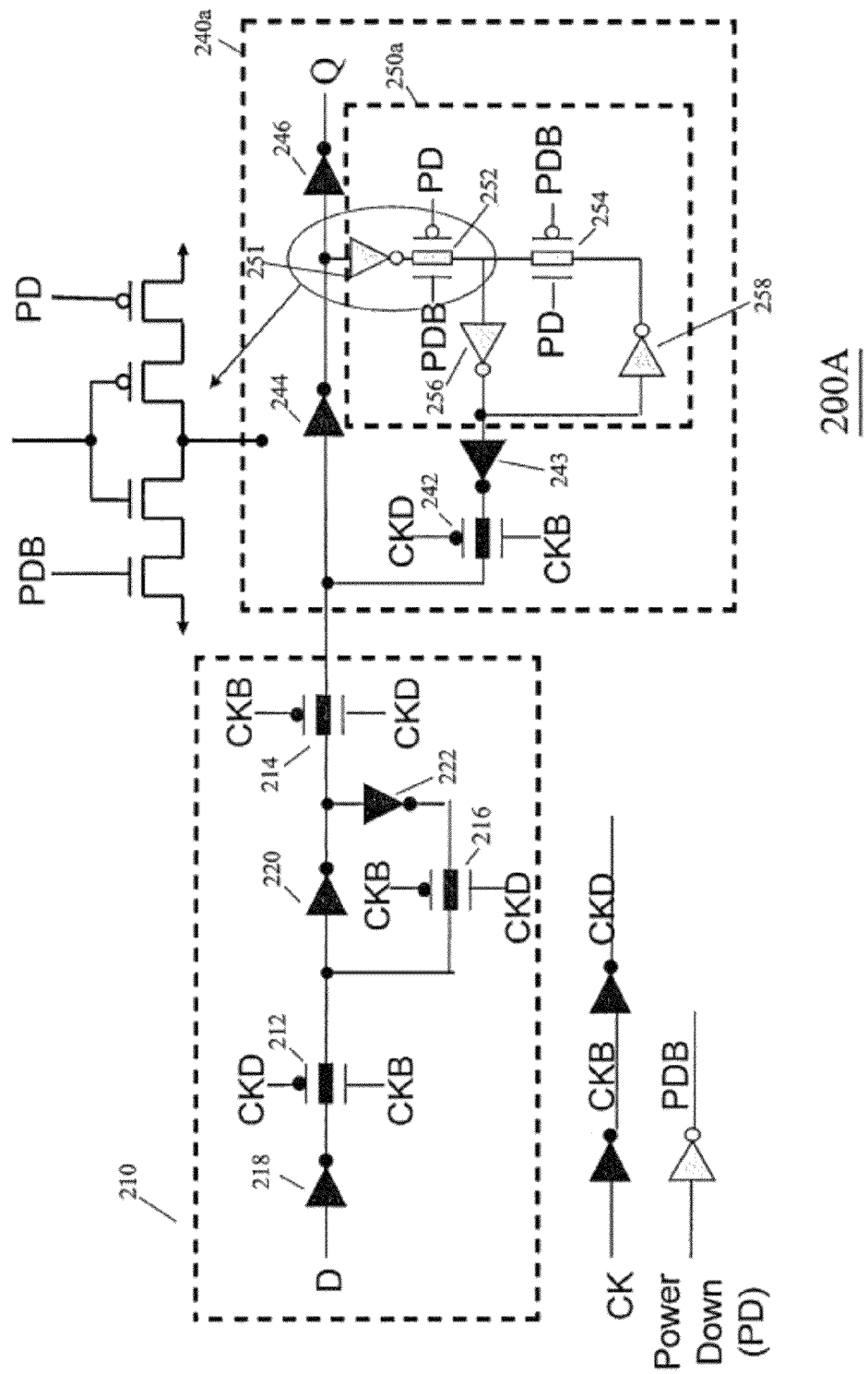
Figure 3C:
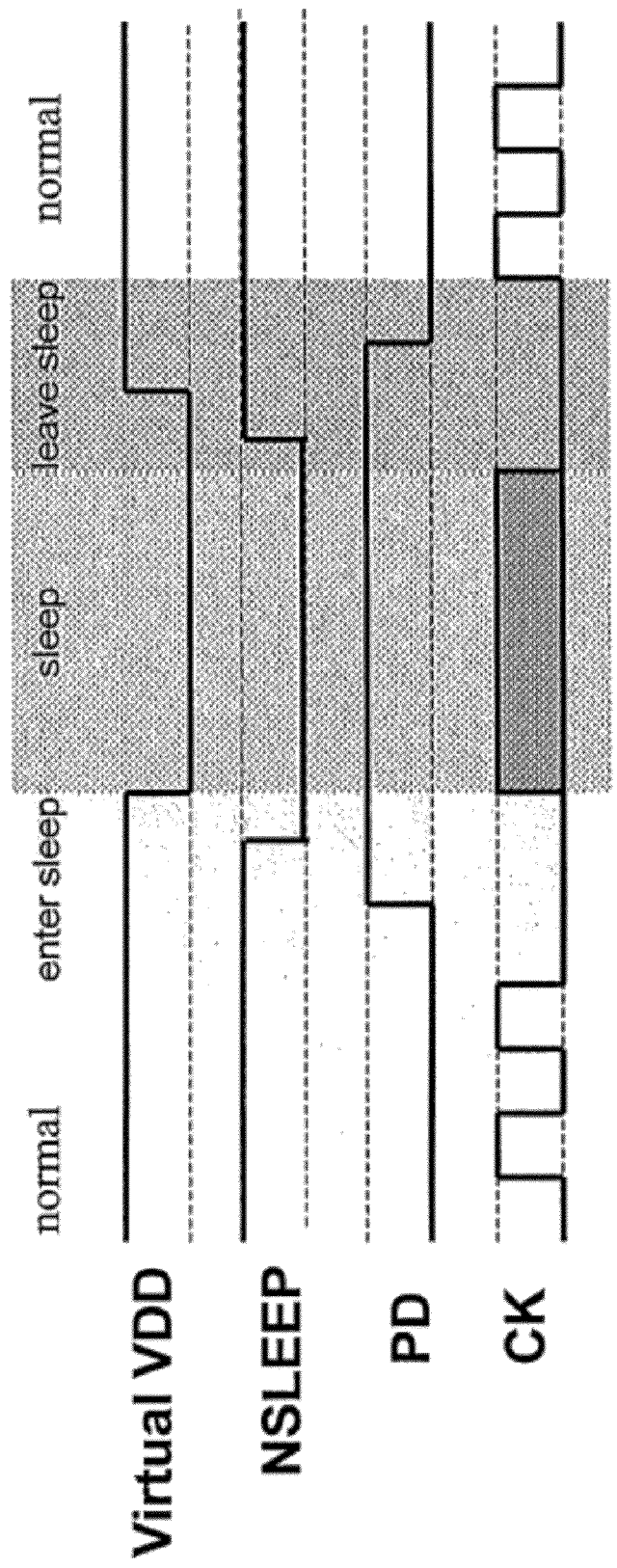
FIGS. 3C and 4C are timing diagrams showing the transition to and from sleep mode for devices having the retention flip-flops of FIGS. 3A/3B and 4A/4B, respectively.

FIG. 3C is a timing diagram illustrating the transition from power up mode to sleep mode, and vice versa, for a retention register 200 illustrated in FIG. 3A. FIG. 3C shows signals (a) during normal device operation, (b) as the devices enter the sleep mode, (c) during the sleep mode, and (d) as the device leaves the sleep mode. As can be seen from FIG. 3C, during the sleep mode the virtual VDD power supply switches from high to low to conserve power. The signal NSLEEP is a block turn off signal and further discussion of this signal is not required in order to understand the operation of the retention flip-flop. The power down signal PD is high during the sleep mode and as the device is transitioning in and out of the sleep mode. Of particular note, the clock signal CK can be turned off in all states but the normal/active operation mode. In order to enter the sleep mode, the clock signal CK is first turned off. Then, signal PD goes high, followed by signal NSLEEP going low to power down a block of devices. Finally, Virtual VDD goes low. This order is reversed to bring the device out of sleep mode.

The embodiment of FIG. 3A, where the retention latch is embedded in the slave latch 240 to preserve data in power down mode, provides excellent timing and power performance as well as area savings. Because the retention latch is embedded in the slave latch, the retention register does not require a balloon latch. As such, the size of the retention latch is kept to a minimum. Timing is improved as there is no balloon latch present that introduces additional capacitive loading on the Q output path. Moreover, the power performance of the device is excellent as only transmission gates 252, 254 and inverters 256, 258 are active in sleep mode. Further, only a single control pin PD is required in order to add save/restore functionality to an existing flip-flop design. In a CPU, for example, which may have tens of thousands of retention registers, requiring only one pin saves a large amount of routing area and complexity when compared to multiple pin designs. Finally, as mentioned above, the power hungry clock pin need not be functional in the sleep mode, which itself can improve power efficiency.

FIG. 3B illustrates an alternative embodiment 200A of the retention flip-flop of FIG. 3A. Similar components are identified with the same reference numbers from FIG. 3A. The retention register 200A is identical to the register 200 of FIG. 3A except for a slightly modified slave latch 240A. Within block 250a, which includes devices that are active in sleep mode, an inverter 251 is added in the primary storage ring. The inverter 251 helps to reduce leakage current from the transmission gate 252 during sleep mode. Additional inverter 243 is also added in the primary storage ring to account for the inversion of the data signal by inverter 251, and to overcome the high leakage current of transmission gate 242 during normal operation mode.

Figure 4A:
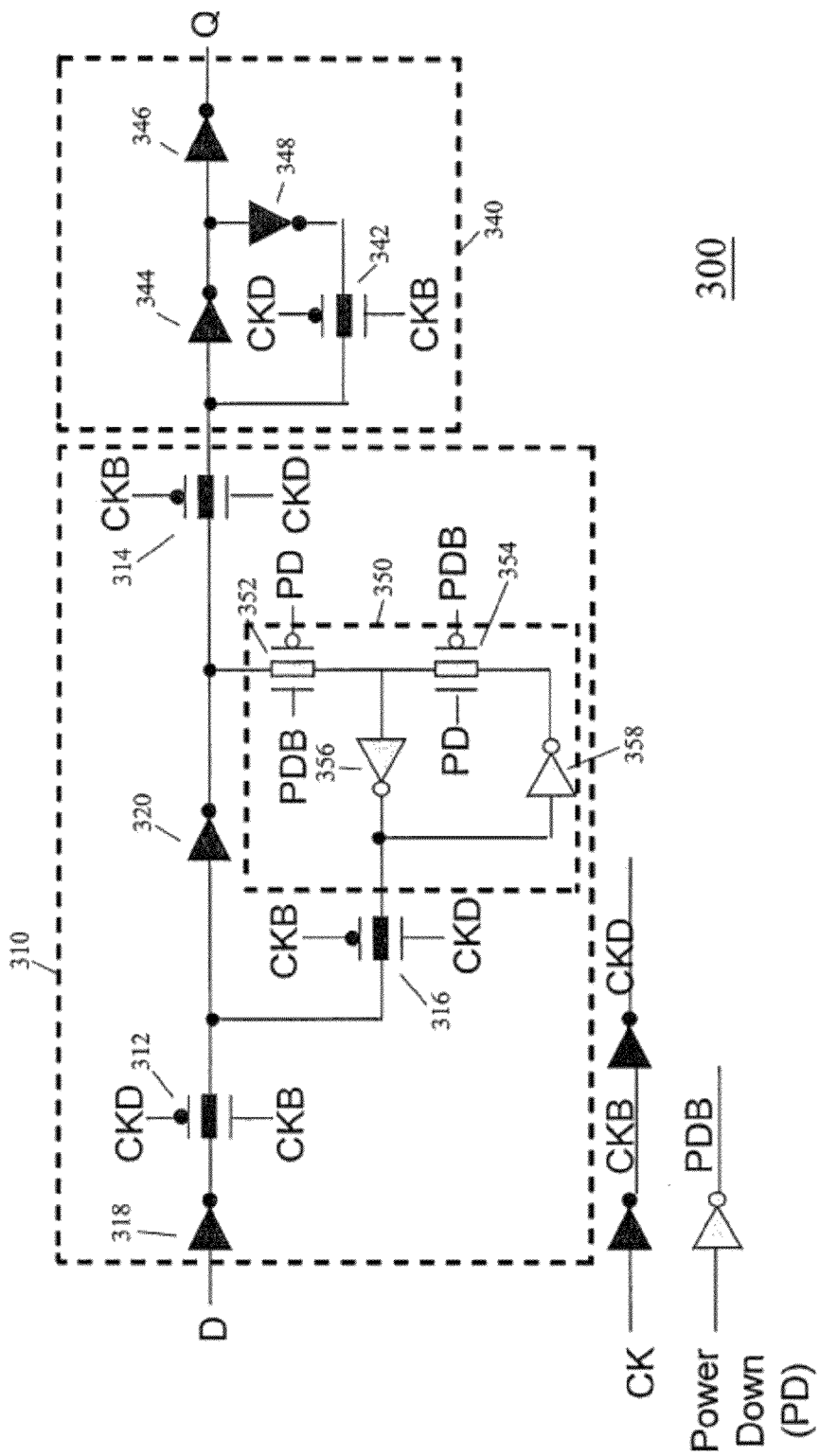
FIGS. 4A-4B and 4D to 4E are embodiments of a retention flip-flop having a retention latch embedded within a master latch.
Figure 4B:
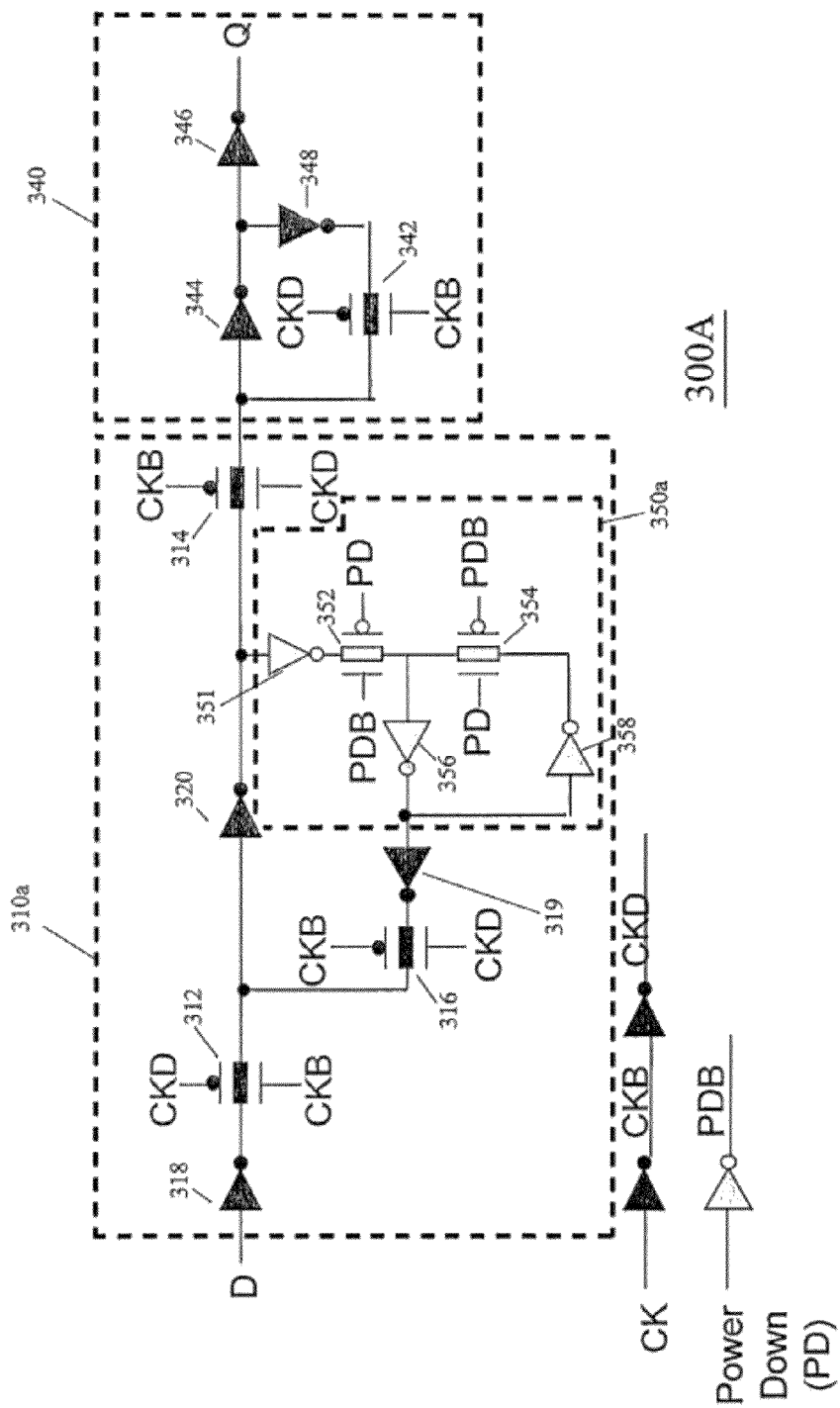

FIGS. 4A and 4B illustrate embodiments of a retention flip-flop where the retention latch is embedded in the master latch rather than the slave latch. Again, all devices illustrated with the heavier gray shading are powered by Virtual VDD whereas the devices in block 350 having the lighter shading are powered by True VDD. The slave latch 340 includes inverters 344, 346, and 348 and transmission gate 342. The operation of the slave latch should be apparent. Like the master latch 210 of FIGS. 3A and 3B, the master latch 310 includes an input inverter 318, a transmission gate 312 for passing data when CKD is low, and an output transmission gate 314 for passing data to the slave latch 340 when CKD is high. As with the slave latch in the embodiment of FIG. 3A, where the retention latch is embedded therein, the master latch 310 has a primary storage ring formed from inverter 320, pass gate 352, inverter 356 and pass gate 316. Since PD is low during normal operation, this primary storage ring is operational during normal operation. A secondary storage ring for storing data during sleep mode is provided in the master latch 310 and is formed from inverters 356, 358 and pass gate 354. The secondary storage ring is operational when PD goes high.

FIG. 4B illustrates an alternative embodiment 300A of the retention flip-flop of FIG. 4A. Similar components are identified with the same reference numbers from FIG. 4A. The retention flip-flop 300A is identical to the flip-flop 300 of FIG. 3A except that master latch 310a is slightly modified in the manner described above in connection with slave latch 240A of FIG. 3B. Within block 350a, which includes devices that are active in sleep mode, an inverter 351 is added in the primary storage ring. The inverter 351 helps to reduce leakage current from the transmission gate 352 during sleep mode. Additional inverter 319 is also added in the primary storage ring to account for the inversion of the data signal by inverter 351, and to overcome the high leakage current of transmission gate 316 during normal operation mode.

Figure 4C:
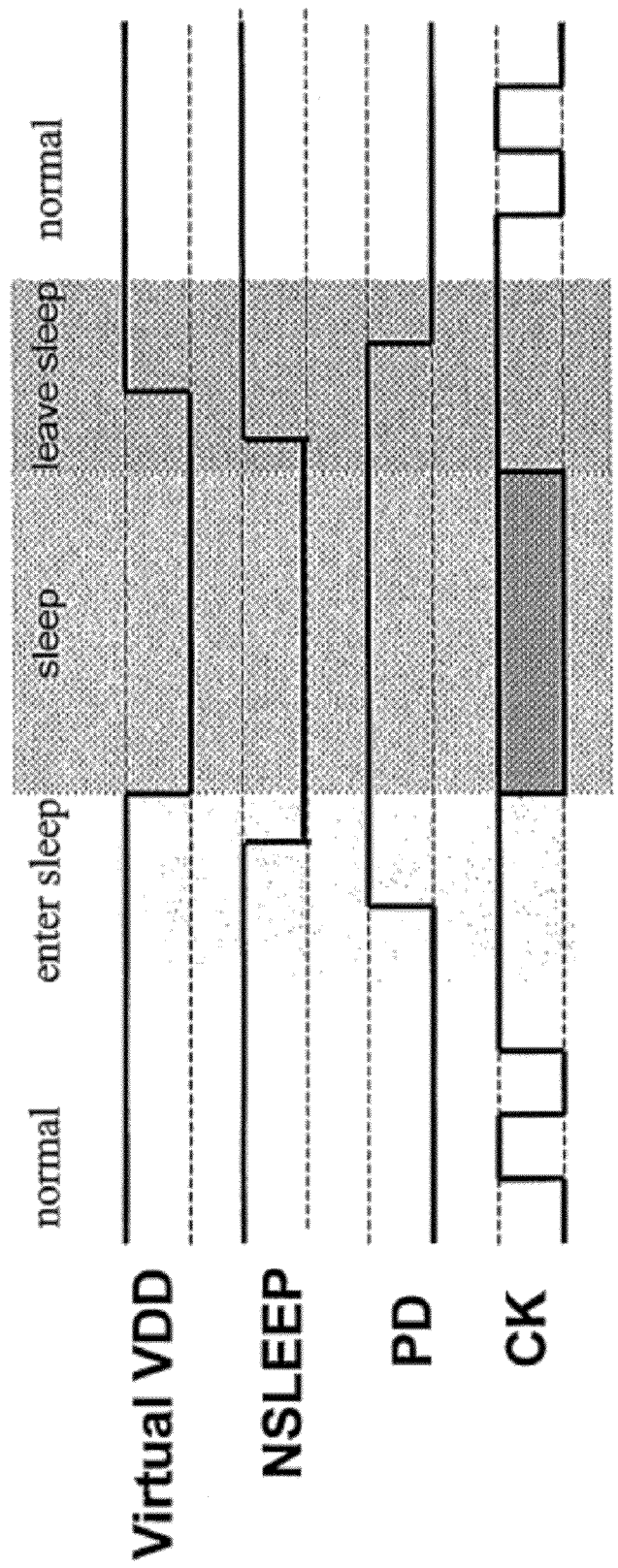

FIG. 4C is a timing diagram illustrating the transition from active to sleep modes and vice versa for the circuits of FIGS. 4A and 4B. As can be seen from the timing diagram, the timing is identical to that shown in FIG. 3C except for clock signal CK remaining high during the transitional enter/leave sleep periods.

Because the retention latch is embedded in the master latch in the embodiments of FIGS. 4A and 4B, the retention flip-flop does not require a balloon latch. As such, the size of the retention latch is kept to a minimum. Timing is also improved as discussed above. Moreover, the power performance of the device is excellent as only transmission gates 352, 354 and inverters 356, 358 are active in sleep mode for the embodiment of FIG. 4A. Additional inverter 351 is active in sleep mode for the embodiment of FIG. 4B. Further, only a single control pin PD is required in order to add the save/restore functionality to the register, which leads to savings in routing area and complexity when compared to multiple pin designs. Finally, as mentioned above, the power hungry clock pin need not be functional in the sleep mode, which improves power efficiency.

Figure 3D:
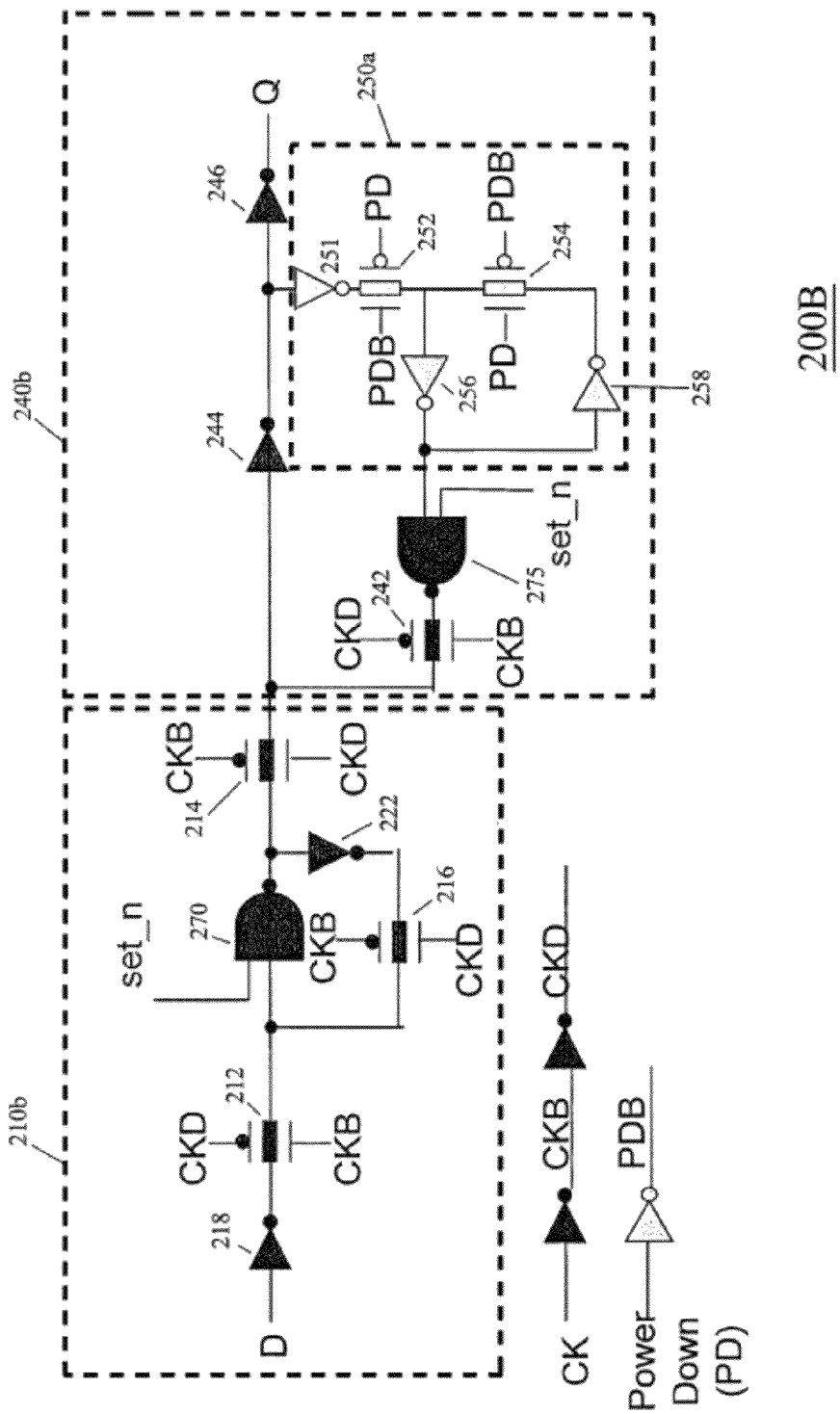

FIG. 3D illustrates an alternative embodiment of a retention register 200B having a retention latch embedded within the slave latch. The retention register 200B is identical to flip-flop 200A of FIG. 3B except for slightly modified master and slave latches 210b and 240b, respectively. More specifically, inverters 220 and 243 are replaced with NAND gates 270, 275, respectively. The NAND gates 270, 275 are responsive to control signal set_n. This embodiment implements a set function into a flip flop having an embedded retention latch. That is, when control signal set n is low, the Q output will be set high regardless of the D input value.

Figure 4D:
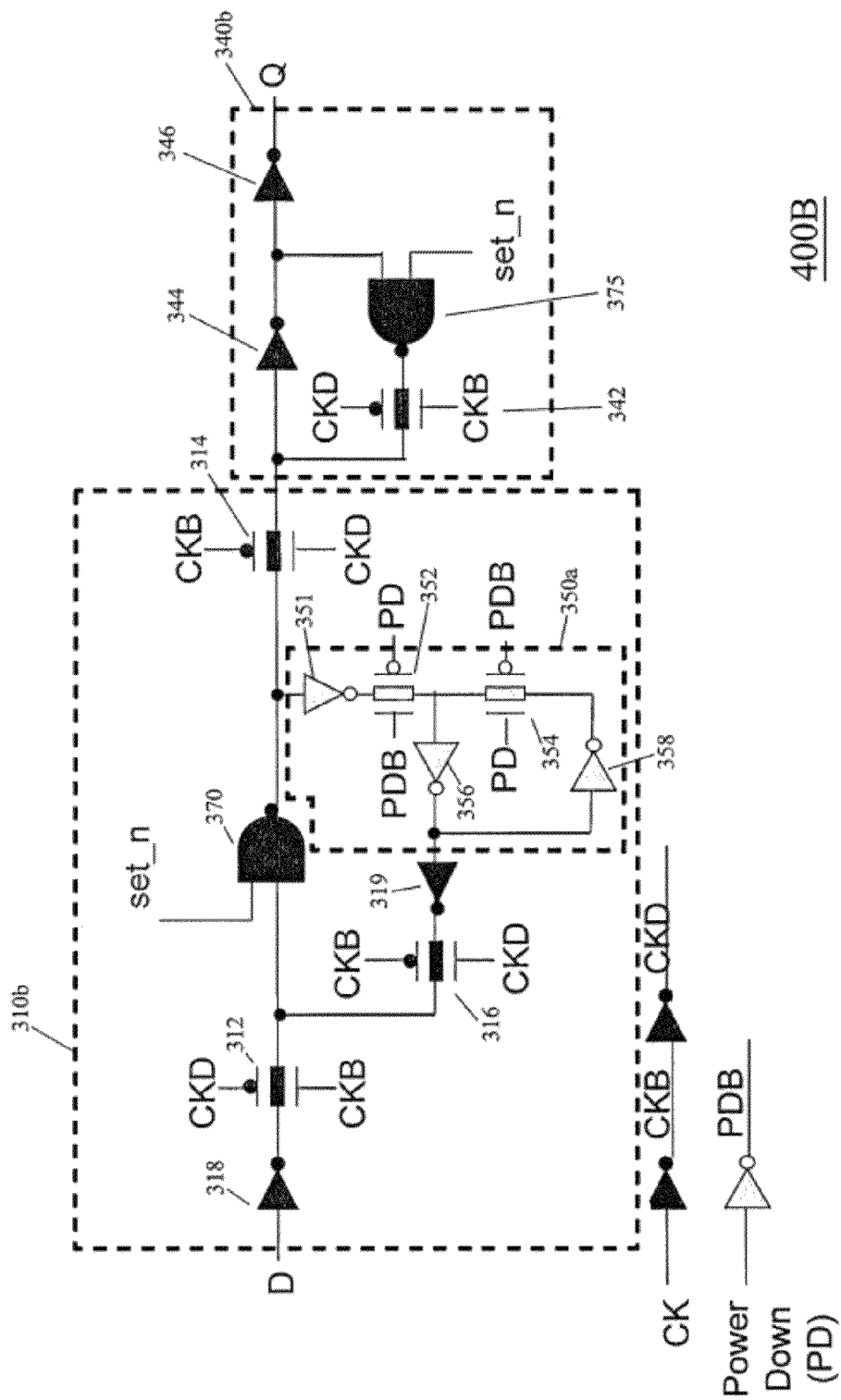

FIG. 4D illustrates an alternative embodiment of a retention register 400B having a retention latch embedded within the master latch. The retention register 400B is identical to flip-flop 400A of FIG. 4B except for slightly modified master and slave latches 310b and 340b, respectively. More specifically, inverters 320 and 348 are replaced with NAND gates 370, 375, respectively. The NAND gates 370, 375 are responsive to control signal set_n. This embodiment implements of a set function into a flip flop having an embedded retention latch.

Figure 3E:
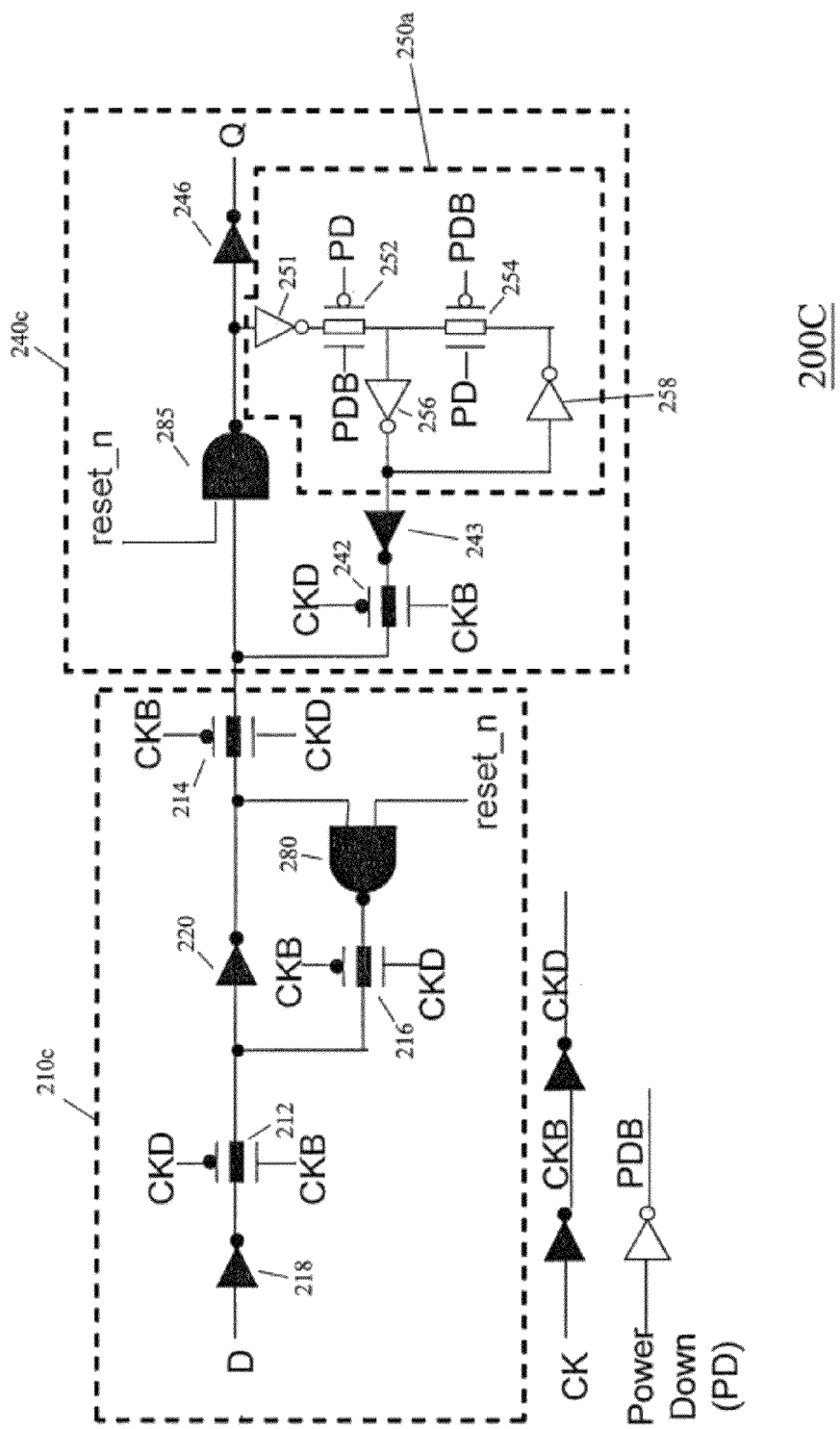

FIG. 3E illustrates an alternative embodiment of a retention flip-flop 200C having a retention latch embedded within the slave latch. The retention flip-flop 200C is identical to flip-flop 200A of FIG. 3B except for slightly modified master and slave latches 210c and 240c, respectively. More specifically, inverters 222 and 244 are replaced with NAND gates 280, 285, respectively. The NAND gates 280, 285 are responsive to control signal reset_n. This embodiment implements a reset function into a flip flop having an embedded retention latch. That is, when reset is low, the Q output will be reset as low regardless of the D input data. While not shown, it should be understood that the NAND gates 270, 275 of the embodiment illustrated in FIG. 3D could be added to this embodiment to implement both set and reset functionality into the flip-flop.

Figure 4E:
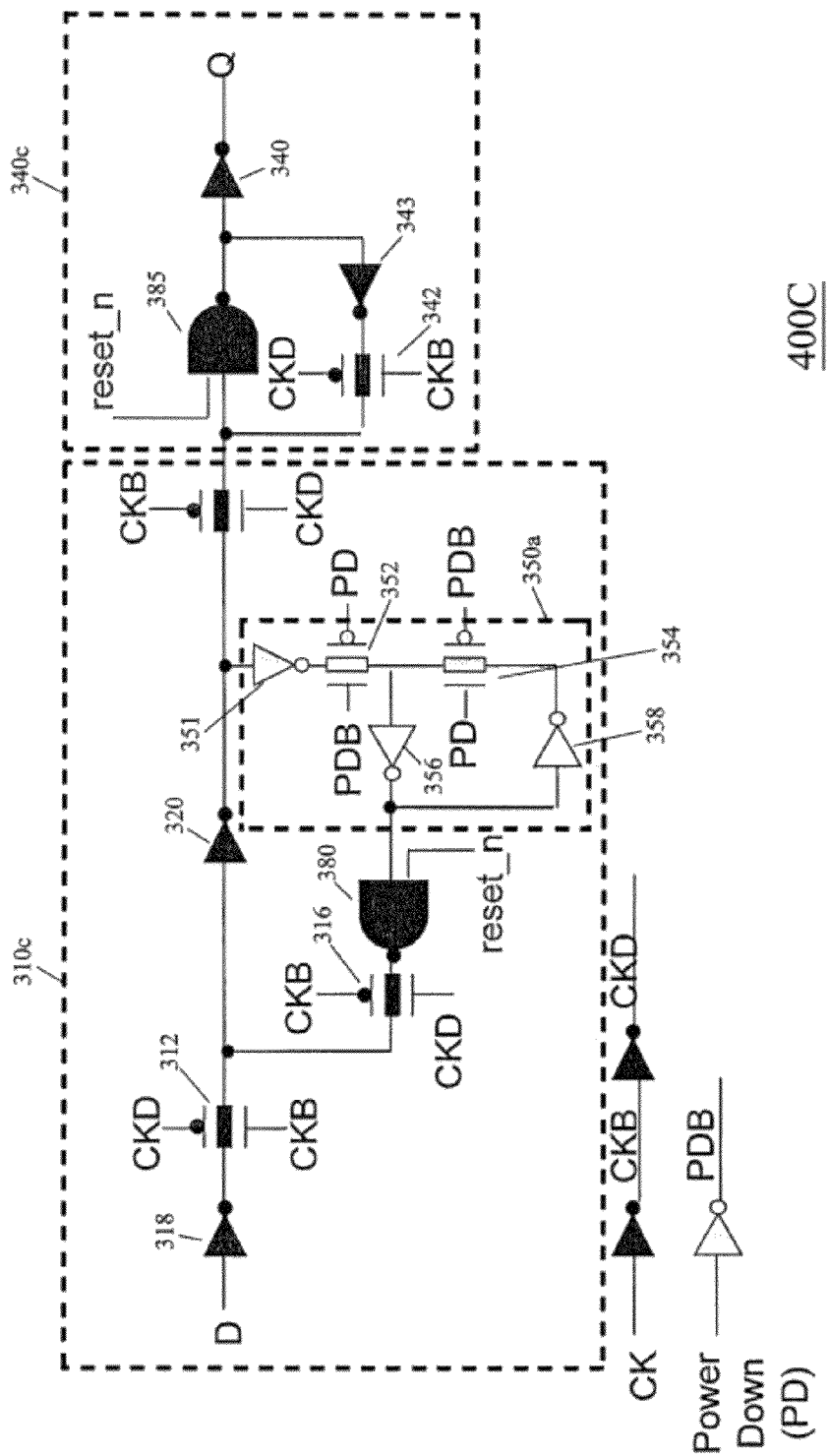

FIG. 4E illustrates an alternative embodiment of a retention flip-flop 400C having a retention latch embedded within the master latch. The retention flip-flop 400C is identical to flip-flop 400A of FIG. 4B except for slightly modified master and slave latches 310c and 340c, respectively. More specifically, inverters 319 and 344 are replaced with NAND gates 380, 385, respectively. The NAND gates 380, 385 are responsive to control signal reset_n. This embodiment implements of a reset function into a flip flop having an embedded retention latch. While not shown, it should be understood that the NAND gates 370, 375 of the embodiment illustrated in FIG. 4D could be added to this embodiment to implement both set and reset functionality into the register.

Figure 5:
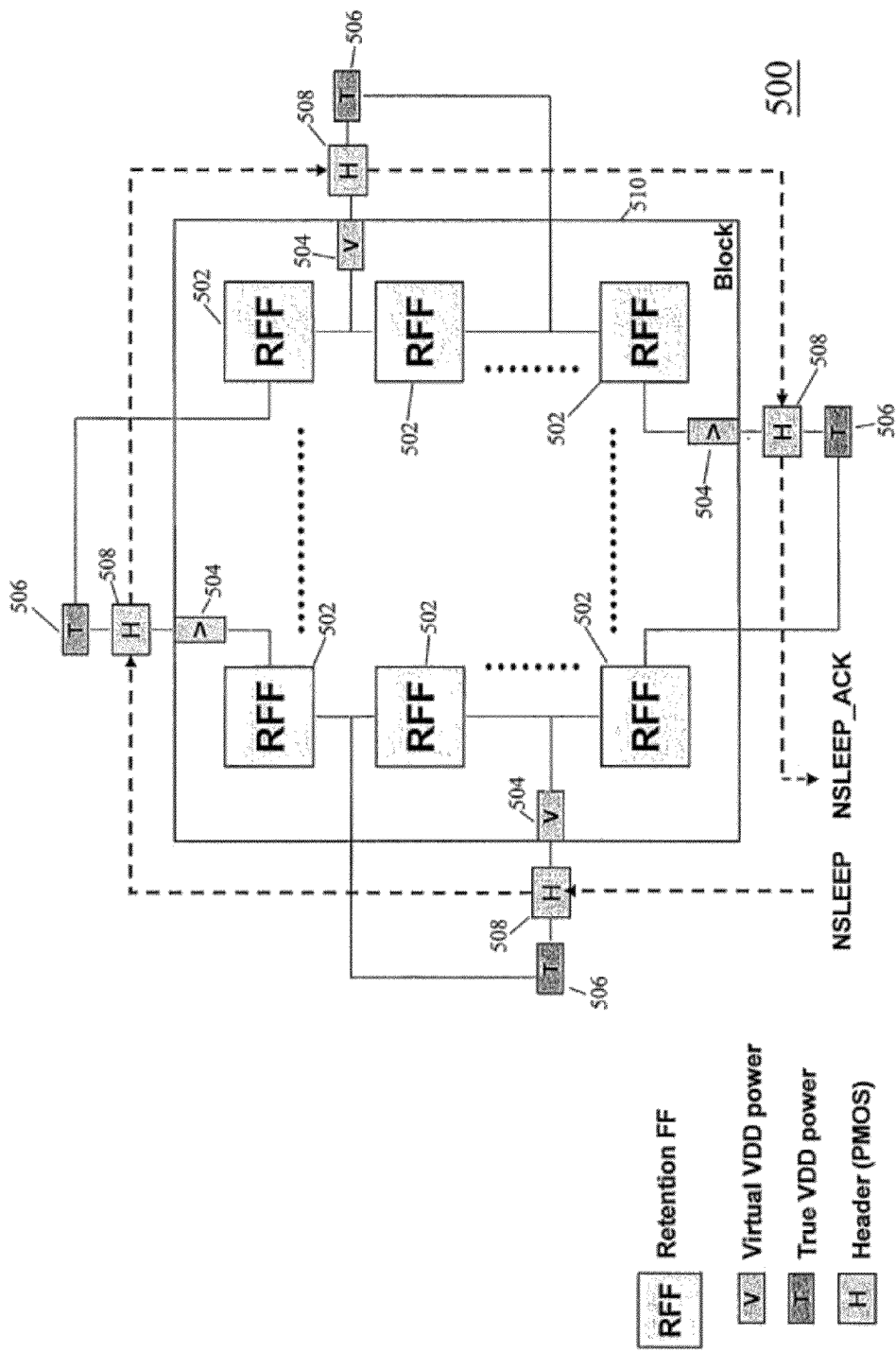
FIGS. 5 and 5A illustrate power connectivity layouts for a system on chip (SoC) design having a single block of retention flip flops.

FIG. 5 illustrates a power connectivity layout for a system on chip (SoC) design 500 having a single block 510 with retention flip flops 502 embedded therein. The retention flip flops 502 may be of the type described above. Each retention flip flop 502 is coupled to a True VDD power source 506 and to a Virtual VDD power source 504. The Virtual VDD power source 504 is connected to the true VDD power source 506 through a header switch 508. The number of header switches needed in a block depends on the power (current) requirement of that block to achieve necessary functional operation. In embodiments where sleep control signal NSLEEP is normally high, as shown in FIGS. 3C and 4C, the header switch 506 can have a PMOS transistor as the power gate. Before switching to sleep mode, the clock should be frozen and the PD signal should be activated to save data into the retention latch of retention flip flop 502. When NSLEEP goes low, the header switch is off and the virtual VDD source 504 is disconnected from the true VDD source 506. In this way, only the retention latch in each retention flip flop 502 is activated to preserve data in sleep mode. When switching back to normal functional operating mode, the signal NSLEEP must go high to resume the connection of the virtual VDD source 504 to the True VDD source 506. Signal PD is then deactivated to restore the corresponding data back to the slave latch of each retention flip flop 502. The signal "NSLEEP_ACK" has the value of "NSLEEP" after it propagates through each power gate. This signal is used to tell when the power up/down operation has been finished.

Figure 5A:
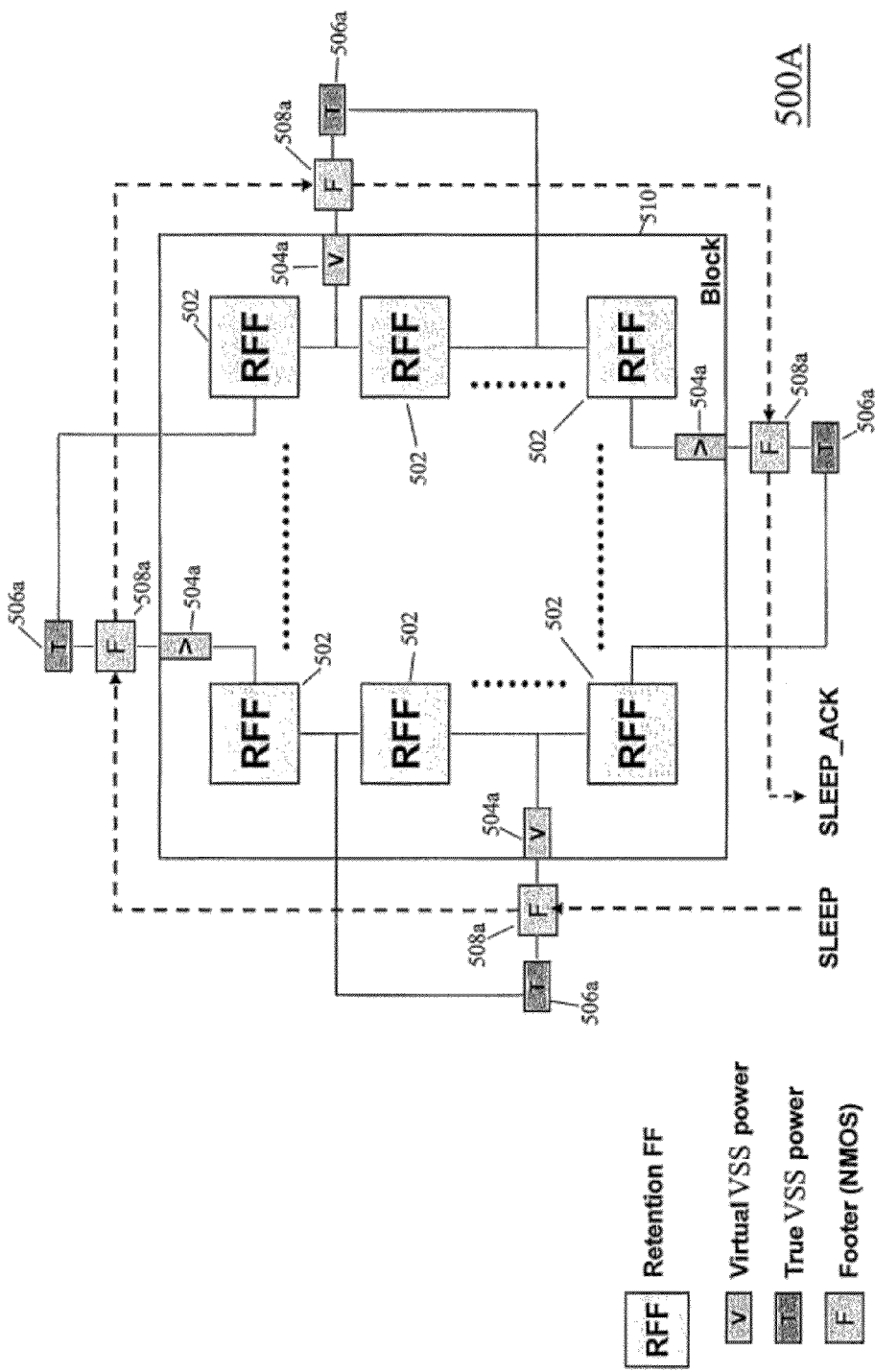

FIG. 5A illustrates an alternative embodiment of a power connectivity layout for a system on chip (SoC) design 500A having a single block 510a with retention flip flops 502 embedded therein. Each retention flip flop 502 is coupled to a True VSS power source 506A and to a Virtual VSS power source 504A. Each Virtual VSS power source 504 is connected to the true VSS power source 506a via a footer switch 508a. The number of footer switches needed in a block depends on the power (current) requirement of that block to achieve necessary functional operation. The footer switches 508a are controlled by signal SLEEP. Each footer switch 508a can use an NMOS transistor as the power gate such that pad 504a is disconnected from pad 506a when SLEEP goes low. Before switching to sleep mode, the clock should be frozen and the power down control signal PD should be activated to save data into retention latch of retention flip flops 502, which may be of the type described above. In this way, only the retention latch in each retention flip flop is activated to preserve data in sleep mode. When switching back to normal operational mode, the signal SLEEP must go high to resume virtual VDD. Signal PD is then deactivated to restore corresponding data back to the slave latch of each retention flip flop 502. The signal "SLEEP_ACK" has the value of "SLEEP" after it propagates through each power gate. This signal is used to tell when the power up/down operation has been finished.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:
1. A master-slave retention flip-flop comprising:
 a master latch adapted to latch an input data signal and to output a latched master latch data signal based on an input clock signal;
 a slave latch coupled to an output of the master latch and adapted to output a latched slave latch data signal based on the input clock signal; and a retention latch embedded within one of the master and slave latches adapted to preserve data in a power down mode based on a power down control signal, wherein the master or slave latch with the embedded retention latch comprises a primary storage ring operable during normal operation mode and a secondary storage ring operable during the power down mode, wherein the primary and second storage rings share at least one device, wherein the primary storage ring comprises first and second inverters, a first pass gate coupled between an output of the first inverter and an input of the second inverter, and a second pass gate coupled between an output of the second inverter and an input of the first inverter, wherein the first pass gate is controlled by the power down control signal and the second pass gate is controlled by the input clock signal, and wherein the secondary storage ring includes the second inverter, a third inverter having an input coupled to the output of the second inverter and a third pass gate coupled between an output of the third inverter and the input of the second inverter, wherein the third pass gate is controlled by the power down control signal.

2. The flip-flop of claim 1, wherein the flip-flop comprises a first set of devices supplied by a virtual VDD, power supply and a second set of devices supplied by a constant VDD power supply.

3. The flip-flop of claim 2, wherein the retention latch is embedded within the slave latch, the master latch includes only devices from the first set of devices and the slave latch includes both devices from the first and second sets of devices.

4. The flip-flop of claim 2, wherein the retention latch is embedded within the master latch, the slave latch includes only devices from the first set of devices and the master latch includes both devices from the first and second sets of devices.

5. The flip-flop of claim 2, wherein a threshold voltage of the first set of devices and a threshold voltage of the second set of devices are different.

6. The flip-flop of claim 1, wherein the at the at least shared one device is an inverter.

7. The flip-flop of claim 1, wherein the flip-flop comprises a first set of devices supplied by a virtual VDD power supply and a second set of devices supplied by a constant VDD power supply, wherein the at least one shared device is a device from the second set of devices.

8. The flip-flop of claim 1, wherein the primary storage ring includes one or both of a logic gate having an input for receiving a data set signal and a logic gate having an input for receiving a data reset signal.

9. The flip flop of claim 1, wherein the primary storage ring further comprises fourth and fifth inverters, the fourth inverter being coupled between the output of the first inverter and the input of the second inverter and the fifth inverter being coupled between the output of the second inverter and the input of the first inverter.

10. The flip flop of claim 9, wherein the fifth inverter is part of a NAND gate having an input for receiving one of a data set signal and a data reset signal, and/or the first inverter is part of a NAND gate having an input for receiving one of the data set and reset signals.

11. A master-slave retention flip-flop comprising:
a master latch adapted to latch an input data signal and to output a latched master latch data signal based on an input clock signal;

a slave latch coupled to an output of the master latch and adapted to output a latched slave latch data signal based on the input clock signal; and a retention latch embedded within one of the master and slave latches adapted to preserve data in a power down mode based on a power down control signal, wherein the flip-flop comprises a first set of devices supplied by a virtual VDD power supply and a second set of devices supplied by an always on VDD power supply, wherein the master or slave latch having the embedded retention latch includes both devices from the first and second sets of devices and the other of the master and slave latches includes only devices from the first set of devices, wherein the input clock signal is inactive during the power down mode, and wherein the second set of devices are designed to exhibit lower leakage current than the first set of devices.

12. The flip-flop of claim 11, wherein the master or slave latch having the embedded retention latch comprises a primary storage ring operable during normal operation mode and a secondary storage ring operable during the power down mode, wherein the primary and second storage rings share at least one device, the at least one shared device being a device from the second set of devices.

13. The flip-flop of claim 11, wherein the at least one shared device is an inverter.

14. The flip-flop of claim 11, wherein the master and slave latches each include one or both of a logic gate having an input for receiving a data set signal and a logic gate having an input for receiving a data reset signal.

15. The flip-flop of claim 11, wherein the retention latch is embedded in the master latch.

16. The flip-flop of claim 11, wherein the retention latch is embedded in the slave latch.

17. The flip-flop of claim 11, wherein a threshold voltage of the first set of devices and a threshold voltage of the second set of devices are different.

18. A master-slave retention flip-flop comprising:
a master latch adapted to latch an input data signal and to output a latched master latch data signal based on an input clock signal;

a slave latch coupled to an output of the master latch and adapted to output a latched slave latch data signal based on the input clock signal; and a retention latch embedded within one of the master and slave latches adapted to preserve data in a power down mode based on a power down control signal, wherein the flip-flop comprises a first set of devices supplied by a virtual VDD power supply and a second set of devices supplied by an always on VDD power supply, wherein the master or slave latch having the embedded retention latch includes both devices from the first and second sets of devices and the other of the master and slave latches includes only devices from the first set of devices, wherein the master or slave latch having the embedded retention latch comprises a primary storage circuit operable during normal operation mode and a secondary storage circuit operable during the power down mode, wherein the primary and second storage circuits share at least one device, the of least one shared device being a device from the second set of devices, wherein the primary storage circuit includes first and second inverters connected in a ring, a first pass gate coupled between an output of the first inverter and an input of the second inverter, and a second pass gate coupled between an output of the second inverter and an input of the first inverter, wherein the first pass gate is controlled by the power down control signal to pass data during the normal operation mode and the second pass gate is controlled by the input clock signal, and wherein the secondary storage circuit includes the second inverter, a third inverter having an input coupled to the output of the second inverter and a third pass gate coupled between an output of the third inverter and the input of the second inverter, wherein the third pass gate is controlled by the power down control signal to pass data during power down mode, the at least one shared device being the second inverter.

19. The flip-flop of claim 18, wherein a threshold voltage of the first set of devices and a threshold voltage of the second set of devices are different.

* * * * *

UNITED STATES PATENT AND TRADEMARK OFFICE
CERTIFICATE OF CORRECTION

PATENT NO. : 8,242,826 B2
APPLICATION NO. : 12/758096
DATED : August 14, 2012
INVENTOR(S) : Shyh-An Chi et al.

Page 1 of 1

It is certified that error appears in the above-identified patent and that said Letters Patent is hereby corrected as shown below:

Column 7, Line 26, Claim 2, delete "," after the word "VDD".

Column 8, Line 62, Claim 18, delete "the of least" and insert -- the at least -- therefor.

Signed and Sealed this
Thirtieth Day of October, 2012

David J. Kappos
*Director of the United States Patent and Trademark Office*